(12) United States Patent
Bock et al.

(10) Patent No.: US 7,586,396 B2
(45) Date of Patent: Sep. 8, 2009

(54) SUPERCONDUCTING RESISTIVE CURRENT LIMITER WITH A SHUNT

(75) Inventors: Joachim Bock, Erftstadt (DE); Steffen Elschner, Heidelberg (DE); Frank Breuer, Bonn (DE)

(73) Assignee: Nexans, Paris (FR)

( * ) Notice: Subject to any disclaimer, the term of this patent is extended or adjusted under 35 U.S.C. 154(b) by 271 days.

(21) Appl. No.: 11/191,237

(22) Filed: Jul. 27, 2005

(65) Prior Publication Data

US 2007/0019344 A1    Jan. 25, 2007

(30) Foreign Application Priority Data

Jul. 30, 2004   (EP)   .................. 04300501
Nov. 10, 2004   (EP)   .................. 04300778

(51) Int. Cl.
*H01F 6/00*   (2006.01)

(52) U.S. Cl. .......................................... 335/216; 361/19
(58) Field of Classification Search ................ 335/216; 29/599; 361/19
See application file for complete search history.

(56) References Cited

U.S. PATENT DOCUMENTS 6,043,731 A * 3/2000 McDougall et al. ......... 338/32 S
6,292,080 B1 * 9/2001 Cottevieille et al. ......... 336/216

FOREIGN PATENT DOCUMENTS

DE          4124980 A1 *   1/1993

* cited by examiner

*Primary Examiner*—Ramon M Barrera
(74) *Attorney, Agent, or Firm*—Sofer & Haroun, LLP

(57) ABSTRACT

A resistive current limiter with at least one tubular high temperature superconductor body is disclosed provided with a shunt of a normal conducting material wound in coil configuration around the surface of the tubular superconductor body.

7 Claims, 1 Drawing Sheet

SUPERCONDUCTING RESISTIVE CURRENT LIMITER WITH A SHUNT

RELATED APPLICATIONS

This application is related to and claims the benefit of priority to European Patent Application No. 04 300 501.6, filed on Jul. 30, 2004 and European Patent Application No. 04 300 778.0, filed on Nov. 10, 2004, the entirety of which are incorporated herein by reference.

FIELD OF THE INVENTION

The present invention relates to a superconducting resistive current limiter, particularly to a ceramic high-temperature superconducting resistive current limiter.

BACKGROUND OF THE INVENTION

Superconductors, in particular ceramic high-temperature superconductors, offer a great potential as fault current limiters which enable rapid and effective current limitation, automatic recovery, negligible impedance during normal operation and application at high voltage.

Current limiters based on high-temperature superconducting materials make use of the property of superconducting materials to switch from their superconducting state with essentially no resistance to a normal conductive and normal resistive state when at least one of its critical temperature ($T_c$), critical magnetic field ($H_c$) or critical current ($I_c$) is exceeded.

For example, in case of fault the current flowing through the superconductor material exceeds the critical current of the superconductor material due to large surge current and the superconducting material undergoes transition from the superconducting state to the normal conducting state. This transition is also termed "quenching". For good operation, after the current limiting event the superconductor should have the capability to return to its superconducting state.

There are known different embodiments of superconducting current limiters. In so coiled resistive (ohmic) limiters a superconducting element becomes normally conductive and commute the current to a limiting resistance.

There are also known so called inductive current limiters. When applied with fault currents, the inductive current limiter provides a high impedance witch limits the fault currents below a threshold level. For example, U.S. Pat. No. 5,140,290 discloses a device for inductive current limiting of an alternating current, in which the current to be limited flows through an induction coil. A hollow cylinder of a high temperature superconductor is arranged in the interior of this coil, and a soft magnetic material with high permeability is arranged concentrically inside. In normal operation (rated current) the superconductivity of the hollow cylinder shields the magnetic field of the induction coil completely from the core and impedance of the induction coil is maintained at a very low level. When a fault current flows through the induction coil the superconductivity of the cylindrical body disappears and the impedance of the induction coil reaches its maximum current-limiting value.

Due to the increasing resistance during quench the superconducting material is heated up along its length. It is essential that the heating of the superconducting material along its length is as uniform as possible in order to avoid thermal destruction of the superconductor due to local overheating ("hot spots").

For solving the problem of local overheating it was known to provide the superconductor body with a shunt of normal conducting material whose resistance is lower than the resistance of the superconducting material in its normal conducting state. In case of a sudden temperature increase current is by-passed to the shunt and heat is dissipated.

In the limiting event e. g. within 100 ms the superconducting component turns to its normal conducting state with increased resistance. At the same time current flowing through the superconducting component switches to the electrically conducting shunt. In the course thereof the shunt material is heated up.

Commonly, the electrically conducting material for the shunt is a metal such as copper or copper alloy.

In the known resistive current limiters the shunt is connected in parallel to the superconductor body.

For example, resistive current limiters are suggested which are composed of a cylindrical tubular superconductor body having a stripe of electrically conducting metal coated on its outer surface in parallel to the longitudinal axis and reaching from one end of the cylindrical tubular body to its other end. Superconductor components related to such configuration are referred to in WO 00/8657.

In DE 42 34 312 a resistive high-temperature superconductor current limiter is disclosed wherein the superconductor component has the shape of a bifilar spiral. On one face of the bifilar spiral made of the superconductor material all along its winding a metallic coating is applied for the shunt.

Since the shunts are arranged in parallel with the superconductor body both the shunt as well as the superconductor body have nearly the same length. The minimum length of the current limiter, however, is defined by the maximum electrical field along the electrically conducting shunt during short circuit. If the electrical field acting on the shunt during short circuit exceeds the maximum value overheating of the shunt occurs with temperatures exceeding the melting point of the shunt material and, consequently, the shunt melts.

For overcoming this problem the overall length of the current limiter and of the superconductor body is increased to an extent so that the electrical field acting on the shunt does not exceed said maximum value. However, this means, that, for example, in high-voltage applications high-temperature superconductor bodies are required having a very long length which in turn requires large material need with subsequent costs.

For illustration, the maximum electrical field applicable to commonly used shunt materials is about 1 V/cm. This means, that if a voltage of 10 kV is applied to the current limiter the length of the superconductor body has to be about 100 m in order to limit the electrical field to which the shunt is subjected during fault event to about 1 V/cm.

There exists a need for a resistive shunt which allows to build up sufficiently high electrical field along the superconducting body during a limiting event, it is within a very short time, usually within 100 ms, having high-voltage criteria and which can be produced in a simple and cheap way and with reduced material necessary.

OBJECTS AND SUMMARY OF THE INVENTION

According to the present invention this problem is solved by a resistive current limiter comprising a tubular superconductor body wherein on the outer surface of the tubular superconductor body an electrically conducting shunt is applied in a coil configuration.

The tubular superconductor body in accordance to the present invention usually has a cylindrical or substantially cylindrical basic shape.

A suitable starting geometry for the tubular superconductor body is a rod or a tube, a cuboids with very rounded edge regions or a similar geometry, above all with substantially cylindrical external geometry. Solid bodies can be converted into the corresponding hollow body by mechanical processing. The tubular superconductor body should, if appropriate, have a maximally uniform thickness, in particular a cylindrical cavity concentric with the external surface.

In principle, however, other cross-sections for the tubular superconductor body and cavity may also be used.

The tubular superconductor body may be made from tubes, similar hollow or solid bodies and, at their ends, advantageously have contact surfaces that are preferably formed from silver sheets or silver paint. These contacts may, however, also have burned-in metal contacts or sheet contacts based on metals other than silver. The contacts serve to connect the superconductor body with other electrical equipment.

In principle the present invention may include any desired ceramic superconductor. Typical examples comprise oxide superconductors based on Bi-Ae-Cu—O, (Bi, Pb)-Ae-Cu—O, (Y,Re)-Ae-Cu—O or (Tl,Pb)—(Ae, Y)—Cu—O. In the above formula Ae means at least one alkaline earth element, particularly, Ba, Ca and/or Sr.

Re means at least one rare earth element, particularly Y or a combination of 2 or more of the elements Y, La, Lu, Sc, Sm, Nd or Yb.

Particularly, preferred examples have a composition of or approximately of $Bi_2(Sr, Ca)_2Cu_1O_x$, $(Bi, Pb)_2(Sr, Ca)_2Cu_1O_x$, $(Bi, Pb)_2(Sr,Ca)_3Cu_2O_{x'''}$, $(Bi, Pb)_2(Sr, Ca)_4Cu_3O_{x''''}$, $(Y, Re)_1Ba_2Cu_3O_y$, $(Y, Re)_2Ba_1Cu_1O_{y'}$, $(Tl, Pb)_2(Ba, Ca)_2Cu_1O_z$, $(Tl, Pb)2(Ca, Ba)_3Cu_2O_{z'''}$, $(Tl, Pb)_2(Ca, Ba)_4Cu_3O_{z''''}$, $(Tl, Pb)_1(Ca, Ba)_3Cu_2O_{z'''}$, $(Tl, Pb)_1(Ca, Ba)_4Cu_3O_{z''''}$.

In the above formular x, x and z stand for the appropriate oxygen content at which the respective compounds exhibit superconductivity.

Especially suitable superconductors are those known by the reference BSCCO-2212, BSCCO-2223, wherein the numerical combinations 2212 and 2223 stands for the stoichiometric ratios of the elements Bi, Sr, Ca and Cu, in particular those, wherein part of Bi is substituted by Pb; and those known by the reference YBCO-123 and YBCO-211, wherein the numerical combinations 123 and 211 stand for the stoichiometric ratios of the elements Y, Ba and Cu.

On demand further elements may be present in the superconductor material. For example, BSCCO based superconductor materials may contain $SrSO_4$ and/or $BaSO_4$ as auxiliaries in an amount up to 20 percent by weight or when $BaSO_4$ is used, preferably only up to about 10 percent by weight.

Such compounds are disclosed for example in EP-A-0 524 442 and EP-A-0 573 798 to which reference is explicitly made.

In general, ceramic oxide high-temperature superconductors as, for example, referenced above and methods for their production are well known in the art. A summary of suitable high-temperature superconductors and production method thereof is given in WO 00/08657.

In principle the tubular superconducting body can be made from a pre-fired, sintered or post-annealed superconducting material. In order to obtain a high-quality superconductor material it is in principle necessary to perform the process stages of pre-firing, such as e.g. calcining, sintering and optionally post-annealing, which may be carried out in a single firing operation or in several, possibly even repeated, sub stages. However, it is also possible, to start with a high-quality superconducting material, which contains a high proportion of one or more superconducting phases.

YBCO-based superconductor bodies can be, for example, prepared by mixing the metal oxides, or compounds which are converted to metal oxides on heating, in suitable molar ratios, heating the mixture in the presence of oxygen to a temperature of between about 800 and about 1100° C. and slowly cooling the mixture in the presence of oxygen over a period of at least about 1 hour.

BSCCO-based superconductor bodies can be prepared by mixing oxides, carbides or carbonates or mixtures of the respective elements in suitable mixing ratios. Subsequently, calcining is carried out at a temperature of about 700 to 900° C. for a period of about 2 to about 20 hours, the calcined mixture is ground, converted into the desired shape and sintered at a temperatures of about 800 to about 1100° C. in the semi- or fully-molten state. Examples of suitable BSCCO-based compounds and production methods thereof are found, for example, in EP-B-0 330 305 and EP-A-0 327 044, to which reference is expressly made here.

Particularly preferred are superconducting bodies produced using a molten casting method, in particular are centrifugal casting method as disclosed, for example, in DE-A-38 30 092, EP-A-0 451 532, EP-A-0 462 409 and EP-A-0 477 493, to which reference is likewise expressly made.

For example, in EP 0 462 409 a process for the production of tubular superconductor bodies is disclosed, wherein an oxide starting mixture is allowed to run in a predetermined stoichiometry at temperatures from 900 to 1100° C. into a casting zone rotating about its horizontal axis. The solidified shaped body is taken out of the casting zone and heat-treated for 4 to 150 hours at 700 to 900° C. in an oxygen containing atmosphere. This process is particularly suitable for BSCCO-based superconductor bodies.

As material for the shunt generally any suitable material can be used having a sufficient resistance for limiting the fault current to the desired value.

Such a material may, for example, be a correspondingly conductive plastic, but a metal is preferably used as a material for the shunt. Examples for suitable metals are CuNi alloy having a resistance of above 30 $\mu\Omega cm$ or stainless steel having a resistance of about 50 $\mu\Omega cm$ at 77 K.

The shunt in accordance to the present invention has the form of a stripe or tape or similar elongated shape. The stripe-type shunt is wound around the tubular superconductor body so that the external surface of the superconductor body and the face of the stripe-type shunt directed to the external surface of the superconductor body are in tight contact in order to provide a low ohmic electrical contact. The contact area between the stripe-type shunt and the superconductor body is defined by the width of the stripe-type shunt. The contact area and the width, respectively, are chosen so that the contact resistance between the superconductor body and the stripe-type shunt is as small as possible. This means, that the contact area should be large so that the contact resistance becomes only small.

The thread profile of the shunt with appropriate pitch and number of windings, respectively, can be determined by the desired overall length of the shunt, which depends on the maximum value of the electrical field to which the shunt can be subjected. For example, there can be one winding per centimeter of superconductor body.

However, as set out above, the thread profile, pitch and number of windings can be freely chosen in accordance to need.

The method by which the stripe-type shunt is fixed to the surface of the superconductor body is not particularly restricted, but shall take into consideration that the contact resistance between the shunt and the superconductor body should be as small as possible. A typical example for a suitable method is soldering.

According to a preferred method the superconductor body is provided with a stripe-type shunt in coil configuration by putting the tubular superconductor body into a corresponding tube made of the material for the shunt and, for example, soldering the tube of the shunt material to the external surface of the superconductor body.

Then, the tube of shunt material is cut into the desired coil configuration by cutting respective grooves into the tube of the shunt material. To this any suitable cutting method can be applied such as, for example, disclosed in WO 99/22386 already referred herein and being directed to methods for producing a coil from a high temperature superconductor material. Examples of suitable methods are sawing, turning or milling.

BRIEF DESCRIPTION OF THE DRAWINGS

In the figures the current flow in the superconducting state and in the limiting case is shown. Both figures show schematically an embodiment of a superconducting resistive current limiter in accordance to the present invention.

DETAILED DESCRIPTION

In the figures the flow direction of the current is indicated by arrows.

Around a tubular superconductor body a stripe-type shunt made of a material with normal conductivity is wound in coil configuration.

Figure 1:
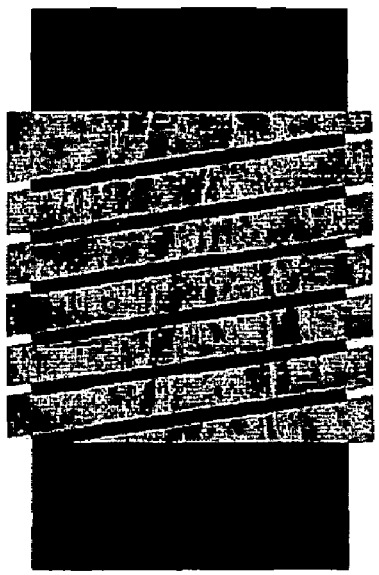
FIG. 1 demonstrates the superconducting state and FIG. 2 the limiting case.
Figure 1:
Figure 1:
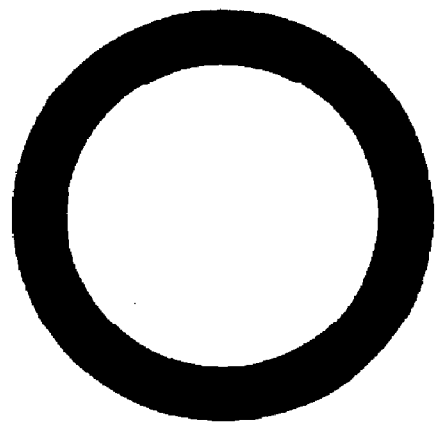

As shown in FIG. 1 in the superconducting state the current flows only in the superconductor body. The effective area is the cross section of the tube in axial direction.

Figure 2:
Figure 2:
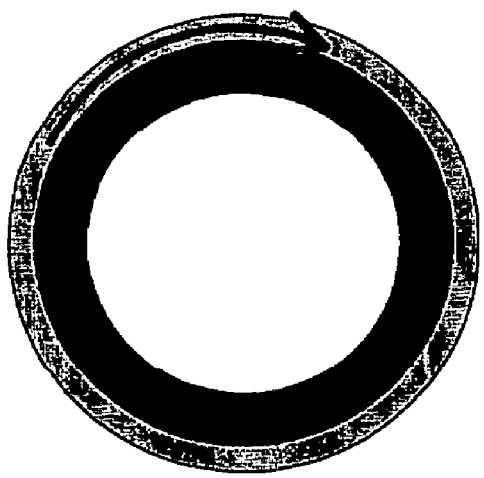

As shown in FIG. 2 in the limiting case the current flows along the coil configuration of the shunt wound around the superconductor body. That is, the current flows circularly around the superconductor body, and, usually, substantially no flow of current does take place along the longitudinal axis of the superconductor body. In the limiting case, typically, approximately 90% of the current flows in the shunt.

As additional benefit of the invention by the coil configuration of the shunt an additional external magnetic field is generated, which decreases the current capacity of the superconductor and causes an additional electrical inductance which further reduces the current.

Furthermore the resistive current limiter of the present invention can comprise more than one superconductor bodies in accordance to the present invention. These superconductor bodies can be connected to one another in series or in parallel, in series being preferred.

By the following specific example the principles of the present invention are illustrated. A tubular superconductor body made of BSCCO 2212 with an outer diameter of 26 mm and an inner diameter of 22 mm is put into a tube of CuNi alloy having an outer diameter of 30 mm and an inner diameter which fits the outer diameter of the tubular superconductor body of about 26 mm resulting in a wall thickness of the CuNi tube of 2 mm.

The CuNi tube is soldered on the surface of the tubular superconductor body. Then, a coil configuration is cut into the CuNi tube with one winding per centimeter of the superconductor body resulting in an overall length of the thus obtained shunt of 176 cm on the tubular superconductor body having a length of 20 cm.

This means for this embodiment if on the shunt an electrical field of 1 V/cm is applied—resulting in an overall voltage of 176 V, an electrical field of 8.8 V/cm is possible for the superconductor body.

The number of windings per cm can be selected according to need and is not particularly restricted.

Thus, it is possible to have less than one winding per cm, e. g. ½ winding/cm, or more such as 2 and more windings per cm.

The invention claimed is:

1. Resistive current limiter comprising:
at least one tubular superconductor body wherein on the external surface of the tubular superconductor body an electrically conducting shunt is applied in a coil configuration, wherein the shunt is contacting said surface of the tubular superconductor body along substantially the length of said superconducting body and, in the event of a fault, by-passes current from the tubular superconductor body at least at any one contact point located along the length of said shunt.

2. Resistive current limiter according to claim 1, wherein the tubular superconductor body is made of a high temperature superconductor material.

3. Resistive current limiter according to claim 1, wherein the high tem-perature superconductor material is selected from Bi-Ae-Cu—O, (Bi, Pb)-Ae-Cu—O, (Y, Re)-Ae-Cu—O and (Tl, Pb)-(Ae, Y)—Cu—O wherein Ae means at least one alkaline earth element and Re means at least one rare earth element.

4. Resistive current limiter according to claim 3, wherein the high temperature superconductor material is selected from high temperature superconductor materials based on BSCCO-2212 or BSCCO-2223.

5. Resistive current limiter according to claim 1 wherein the material for the electrically conducting shunt in coil configuration is selected from copper, CuNi alloy, or stainless steel.

6. Resistive current limiter according to claim 1, wherein the electrically contacting shunt is wound on the superconductor body resulting in a thread profile with one winding per one centimeter of the superconductor body.

7. Resistive current limiter according to claim 1, wherein the resistive current limiter further comprises two or more superconductor bodies connected to one another in series or in parallel.

* * * * *